(12) United States Patent
Lawrence et al.

(10) Patent No.: US 10,761,613 B2
(45) Date of Patent: Sep. 1, 2020

(54) ERGONOMIC KEYBOARD POSITION ADJUSTMENT

(71) Applicant: Intel Corporation, Santa Clara, CA (US)

(72) Inventors: Sean J. Lawrence, Bangalore (IN); Krishnakumar Varadarajan, Bangalore (IN); Ayeshwarya Mahajan, Bangalore (IN); Raghavendra Angadimani, Bangalore (IN); Samarth Alva, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,177

(22) Filed: Sep. 28, 2018

(65) Prior Publication Data
US 2019/0041996 A1 Feb. 7, 2019

(51) Int. Cl.
*H03K 17/96* (2006.01)
*G06F 3/02* (2006.01)
*G06F 1/16* (2006.01)

(52) U.S. Cl.
CPC ............ *G06F 3/0208* (2013.01); *G06F 1/166* (2013.01); *G06F 1/1667* (2013.01); *H03K 17/962* (2013.01); *H03K 2217/96003* (2013.01)

(58) Field of Classification Search
CPC ...... G06F 3/0208; G06F 1/166; G06F 1/1667; H03K 17/962; H03K 2217/96003
See application file for complete search history.

(56) References Cited

U.S. PATENT DOCUMENTS

| | | | |
|---|---|---|---|
| 5,564,844 A | 10/1996 | Patterson, Jr. et al. | |
| 8,139,034 B2 | 3/2012 | Albouyeh et al. | |
| 9,823,631 B1 | 11/2017 | Loo et al. | |
| 2005/0089355 A1* | 4/2005 | Benja-Athon | G06F 3/0208 400/472 |
| 2012/0274565 A1* | 11/2012 | Moser | G06F 1/1616 345/168 |
| 2014/0172131 A1 | 6/2014 | Hung et al. | |
| 2014/0267068 A1* | 9/2014 | Smith | H03K 17/962 345/173 |
| 2015/0227213 A1* | 8/2015 | Cho | G06F 3/0219 345/157 |
| 2016/0187988 A1* | 6/2016 | Levesque | F16M 11/18 345/156 |
| 2017/0115745 A1* | 4/2017 | Hadas | G06F 3/0216 |

OTHER PUBLICATIONS

Taylor et al., "Type—Hover—Swipe in 96 Bytes: A Motion Sensing Mechanical Keyboard," CHI 2014, One of a CHInd, Toronto, ON, Canada, 10 pages.

* cited by examiner

*Primary Examiner* — Andrew Sasinowski
(74) *Attorney, Agent, or Firm* — Hanley, Flight and Zimmerman, LLC

(57) ABSTRACT

Examples apparatus, systems, articles of manufacture and methods to adjust a keyboard position are disclosed. An example keyboard position adjustment system includes a keyboard orientation detector to determine a first keyboard position of a keyboard and/or a hand position detector to determine a hand position near the keyboard. The example system also includes an adjuster to move the keyboard to a second keyboard position based on the first keyboard position and/or the hand position.

24 Claims, 7 Drawing Sheets

ERGONOMIC KEYBOARD POSITION ADJUSTMENT

FIELD OF THE DISCLOSURE

This disclosure relates generally to keyboard placement, and, more particularly, to ergonomic keyboard position adjustment.

BACKGROUND

Keyboards today are manually adjusted by a user to facilitate comfortable typing. A standalone keyboard has projections on the base that are manually adjusted to adjust the tilt of the keyboard relative to the surface on which the keyboard is positioned. For laptop and other clamshell form factors, the positions of the keyboards are fixed relative to the base of the device.

BRIEF DESCRIPTION OF THE DRAWINGS

The figures are not to scale. In addition, in general, the same reference numbers will be used throughout the drawing(s) and accompanying written description to refer to the same or like parts.

DETAILED DESCRIPTION

Users experience fatigue and/or discomfort when typing on a keyboard that is not positioned ergonomically. Disclosed herein are apparatus, systems, articles of manufacture, and methods to determine an ergonomically enhanced position for a keyboard of an electronic device with respect to a surface upon which the device is positioned and the position of the user's hands with respect to the keyboard. The ergonomically enhanced position may be a position that is more comfortable or otherwise more ergonomically pleasing to the user. The examples disclosed herein also adjust the keyboard position to the ergonomically enhanced position, thus effecting better ergonomics. The keyboard position adjustment, in some examples, is an adjustment of the keyboard tilt angle. In some examples, the keyboard are adjusted automatically once an ergonomically enhanced positioned is identified. Also, in some examples, the ergonomically enhanced position is an optimal ergonomic position. The examples disclosed herein can be used with external keyboards, laptops, phones, tablets, and other electronic devices.

The examples disclosed herein estimate the position and/or orientation of the user's hands and the keyboard with respect to the support surface of the base of the device to determine an ergonomically enhanced position of the keyboard and also to move the position the keyboard into the ergonomically enhanced position. The position and orientation of the user's hands may be determined by use of sensors on wrist and/or palm rests of the device as well as by analyzing the angle of finger approach and finger press on the keyboard keys when the user is typing. The position of the keyboard with respect to the support surface may be determined by pressure and orientation sensors on the base of the device.

Ergonomic positioning of keyboards for users allows the users to use clamshell/laptop form factors as well as external keyboards with greater convenience and comfort. The keyboard positions are customized to the particular user. In addition, the keyboard positions are adjusted as the user changes the position of the device such as, for example, changing the position of a laptop in the user's lap. The adjustments may occur automatically without user input and/or may be effected by the examples disclosed herein after a user consents or otherwise provides input for the position adjustment to take effect.

Figure 1:
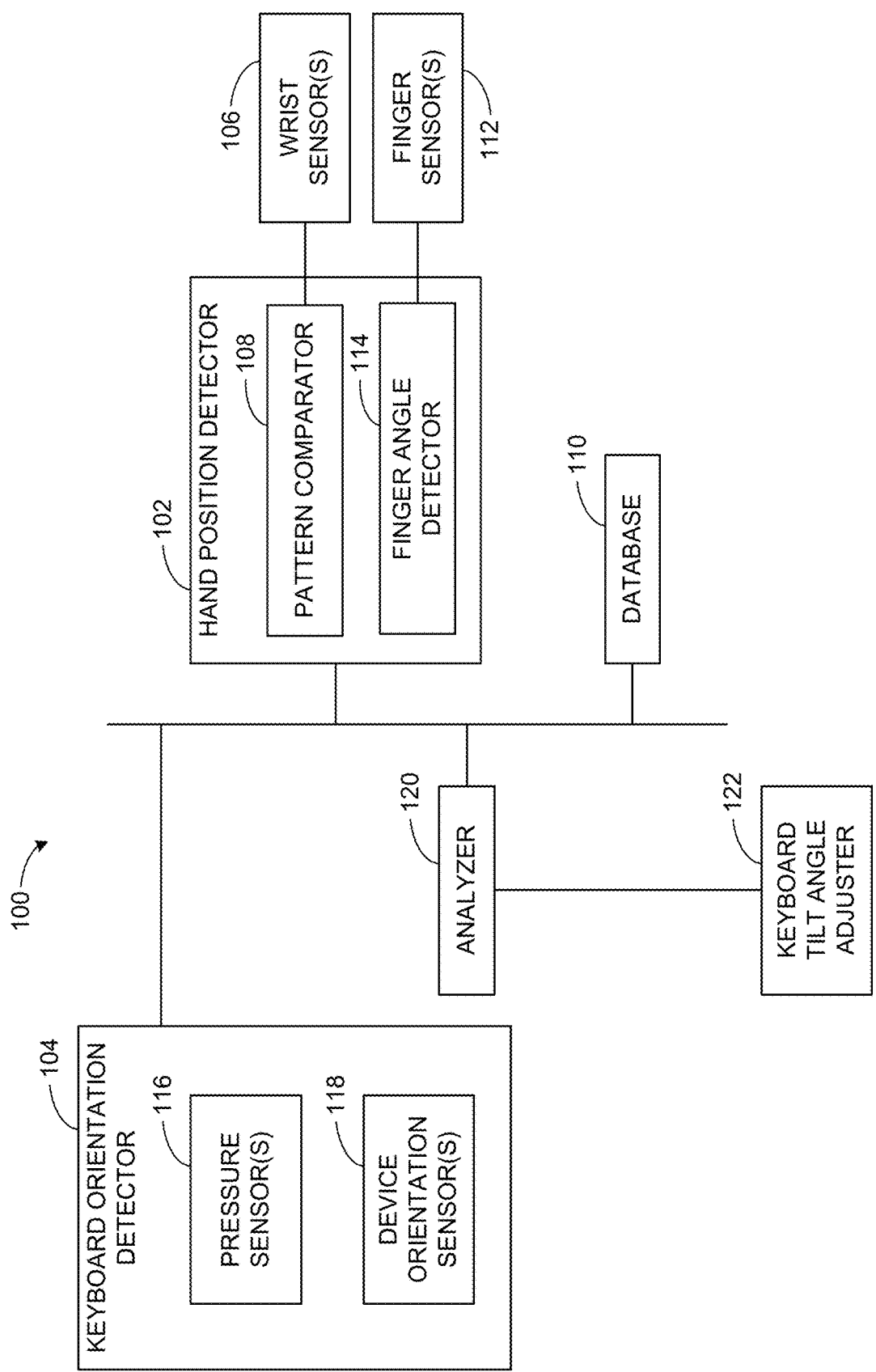
FIG. 1 is a block diagram of an example system to position a keyboard in accordance with the teachings of this disclosure.

To determine the position for ergonomically enhanced adjustment of a keyboard, the examples disclosed herein use data related to the orientation or position of the user's wrists, hands, and fingers with respect to the keyboard plane and data related to the keyboard plane orientation with respect to the support surface (the surface on which the keyboard or device is placed). FIG. 1 is a block diagram of an example system 100 to position a keyboard that includes an example hand position detector 102 to detect the orientation or position of the user's wrists, hands, and/or fingers. The example system 100 also includes an example keyboard orientation detector 104 to detect the orientation or position of the keyboard. In addition, the example system 100 includes example wrist sensor(s) 106, an example pattern comparator 108, an example database 110, example finger sensor(s) 112, an example finger angle detector 114, example pressure sensor(s) 116, an example device orientation sensor(s) 118, an example analyzer 120, and an example keyboard tilt angle adjuster 122. The example wrist sensor(s) 106, the example finger sensor(s) 112, the example pressure sensor(s) 116, and the example device orientation sensor(s) 118, along with other sensors and data gathering devices disclosed herein provide sensor data for analysis in the example system 100.

Figure 2:
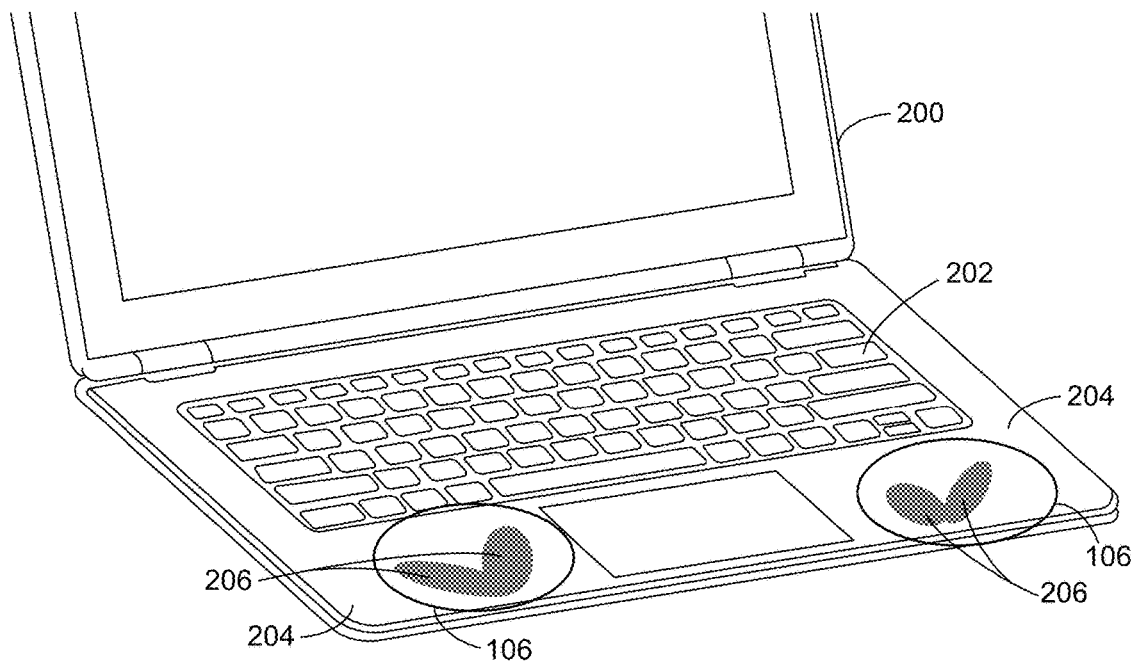
FIG. 2 is a schematic illustration of example sensors to determine a hand position.

The example wrist sensor(s) 106 sense the presence and position of a user's wrists. An example wrist sensor 106 illustrated in FIG. 2 includes pressure sensor(s) that sense the presence of a user's palms and/or wrists on a device 200 adjacent a keyboard 202. In the illustrated example, the wrist sensors 106 are located on palm/wrist rests 204 of the device 200. When a user is using the device 200, the user's palms and/or wrists make contact areas and pressure patterns 206 on the device 200.

The example hand position detector 102 of the example system 100 includes the pattern comparator 108. The pattern comparator 108 compares the pressure patterns 206 made by the user's palms and/or wrists with pressure patterns stored in an example library such as the database 110. The pressure patterns stored in the database 110 are patterns correlated with known wrist positions. The pattern comparator 108 compares the pressure patterns 206 with the pressure patterns of the known wrist positions to determine a similarity or dissimilarity of the pressure patterns 206 with the pressure patterns for the known wrist positions. The pattern comparator 108 can identify a user's wrist position as matching a known wrist position based on the pressure patterns 206 matching a stored pressure pattern completely or matching a threshold such as, for example, a percentage match of the user's pressure pattern 206 with the stored pressure patterns.

Figure 3:
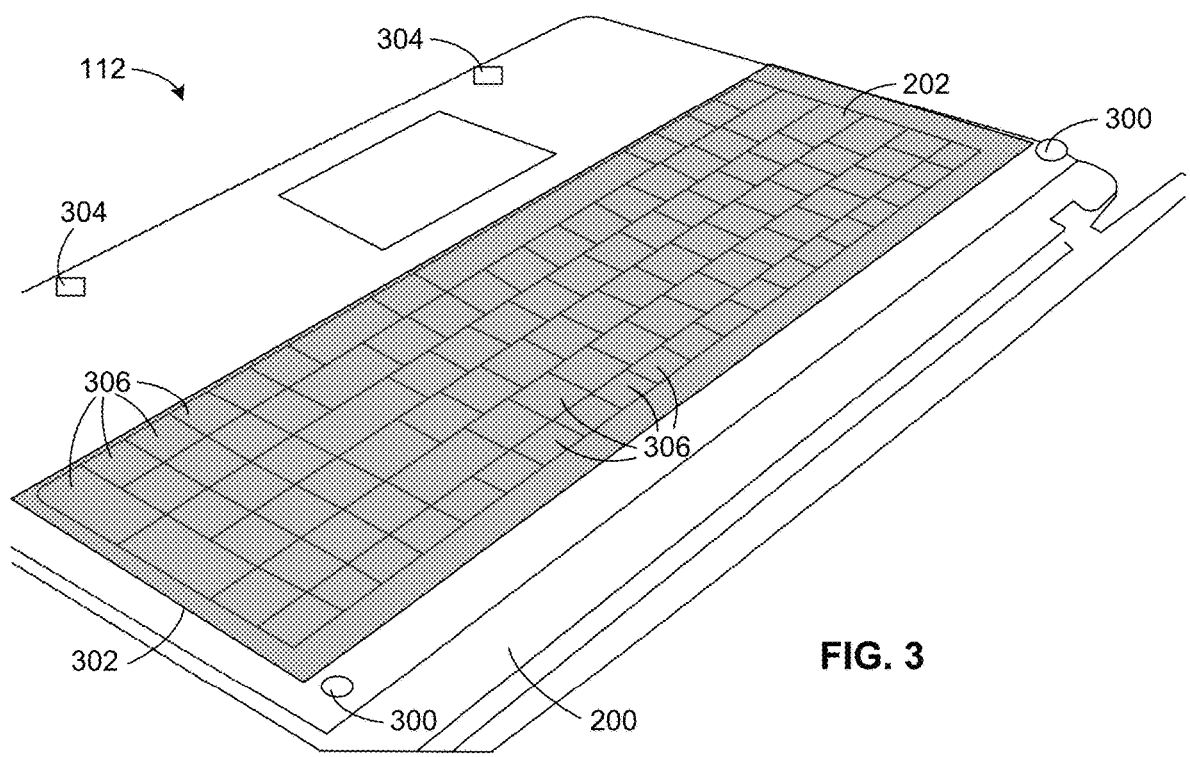
FIG. 3 is a schematic illustration of additional example sensors to determine a hand position.

The example system 100 also includes the finger sensor(s) 112 that gather data related to a user's finger position and movement that is transmitted to an example finger angle detector 114 of the example hand position detector 102. FIG. 3 illustrates an example finger sensor 112. The example of FIG. 3 is an infrared sensor. The finger sensor 112 includes one or more infrared projectors 300 that project infrared light over the keyboard 202, creating an infrared curtain 302. The finger sensor 112 also includes one or more infrared cameras 304 that sense and record when a user's finger occludes infrared light in the infrared curtain 302. In some examples, the infrared projectors 300 include a plurality of LEDs positioned in perpendicular rows and columns to create a grid for the infrared curtain 302. The finger angle detector 114 analyzes the data from the finger sensors 112 and, for example, the infrared cameras 304 to determine an angle at which the user's fingers strike keys 306 of the keyboard 202, i.e., the angle and direction of arrival of the finger before the finger presses the key 306.

In some examples, the finger sensor(s) 112 can include ultrasonic sensors in addition or as an alternative to the infrared curtain 302. Also in some examples, a capacitive hover over the keyboard 202 or other floating touch technology may be used to determine the angle of approach and final touch of the keys 306. With the capacitive hover, an X-Y grid of electrodes covers the keyboard. When a voltage is applied to the electrodes and when a finger is near one or more of the electrodes, there is a measurable change in capacitance. The example finger angle detector 114 compares the capacitance measurements from the electrodes and can accurately pinpoint the location of the finger positions.

In addition, in some examples, there are pressure sensors disposed on the keys 306. For example, the finger sensor 112 may include a pressure sensor placed on a cap of a key 306, which detects pressure exerted by the user's finger on the key 306. The finger angle detector 114 can use the pressure data to estimate how the user is positioned or oriented with respect to the keyboard 202.

Figure 4:
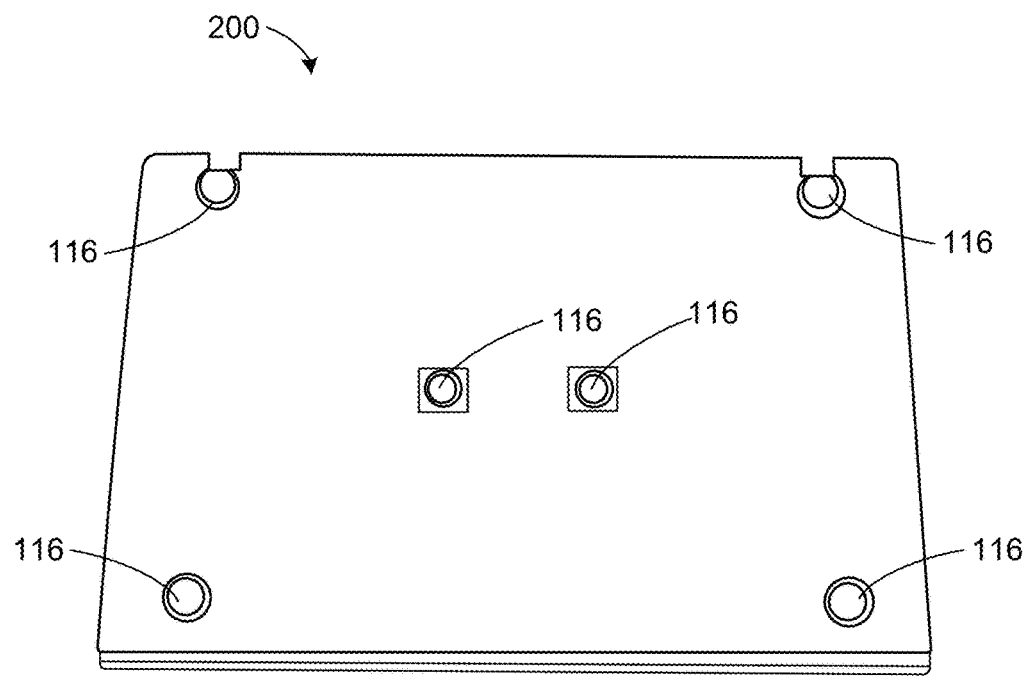
FIG. 4 is a schematic illustration of example sensors to determine a keyboard position.

The example keyboard orientation detector 104 also is coupled to and/or integrated with a plurality of sensors including, for example, the example pressure sensor(s) 116 and the example device orientation sensor(s) 118. FIG. 4 illustrates example pressure sensors 116 that are disposed on a bottom of a base 400 of the device 200. In the example of FIG. 4, there are six pressure sensors 116 on the base of the device 200. The pressure sensors 116 provided data indicated the presence of the device 200 on an underlying surface. Additionally or alternatively, in some examples infrared sensors, ultrasonic sensors, and/or capacitance sensors may be used to determine contact of the base 400 of the device 200 with an underlying surface.

The example device orientation sensor(2) 118 include, for example, a gyroscope and/or an accelerometer to gather data related to the orientation of the device 200. The keyboard orientation detector 104 uses data from the device orientation sensor(s) 118 to determine the direction the keyboard 202 is facing, whether the keyboard 202 has been moved, if the keyboard 202 is positioned on a surface, the relative position (e.g., tilt) of the keyboard 202 to the base 400 of the device 200 and/or the horizontal plane.

The example system also includes the example analyzer 120, which analyzes current user data including data from the wrist sensor(s) 106, the finger sensor(s), the pattern comparator 108, the finger angle detector 114, the hand position detector 102, the pressure sensor(s) 116, the device orientation sensor(s) 118, and/or the keyboard orientation detector 104. The analyzer analyzes the data gathered from the wrist sensor(s) 106, the finger sensor(s) 112, the pressure sensor(s) 116, and/or the device orientation sensor(2) 118, and/or the resulting data from the pattern comparator 106, the finger angle detector 114, the hand position detector, and/or the keyboard orientation detector 104 to determine if the keyboard 202 is disposed in an ergonomic position for the user. For example, the database 110 may store combinations of wrist pressure patterns, wrist positions, finger angle positions, hand positions, keyboard orientations, and keyboard positions that correspond to an ergonomically positioned keyboard. The analyzer 120 determines if the current user data indicates an ergonomically placed keyboard 202 based on the matching combination of user data with stored data of known ergonomic positions or a substantial match or satisfaction of a threshold (e.g., percentage match between the user data and the stored data).

If the analyzer 120 determines that the keyboard position does not correspond to an ergonomic position, then the analyzer 120 determines that the keyboard 202 is to be elevated, have its tilt angle changed, and/or otherwise adjusted. The terms "tilt" and "tilt angle" are used interchangeably throughout this disclosure. In some examples, the analyzer 120 determines the new or updated position of the keyboard 202 relative to and based on the current or previous position and/or orientation of the base 400 of the device 200. A combination of one or more of the above disclosed inputs, e.g., the sensor data and/or the user data, may be used to determine the orientation of the device 200 and of the keyboard 202 with respect to the plane of the supporting surface and the user's hands with respect to the plane of the keyboard 202 to reorient and reposition the keyboard 202 ergonomically. In some examples, each input is used individually to determine an ergonomically enhanced position for the keyboard 202.

Also, in some examples, a keyboard position may be indicative of an ergonomic position because a threshold correlation between the user data and the stored data is satisfied, but the analyzer 120 may determine, based on the combination of data stored in the database 110 that a different keyboard position would be a more ergonomic position. In such examples, the analyzer 120 can initiate movement of the keyboard 202 to the different keyboard position to enhance the ergonomic position of the keyboard 202.

Figure 5:
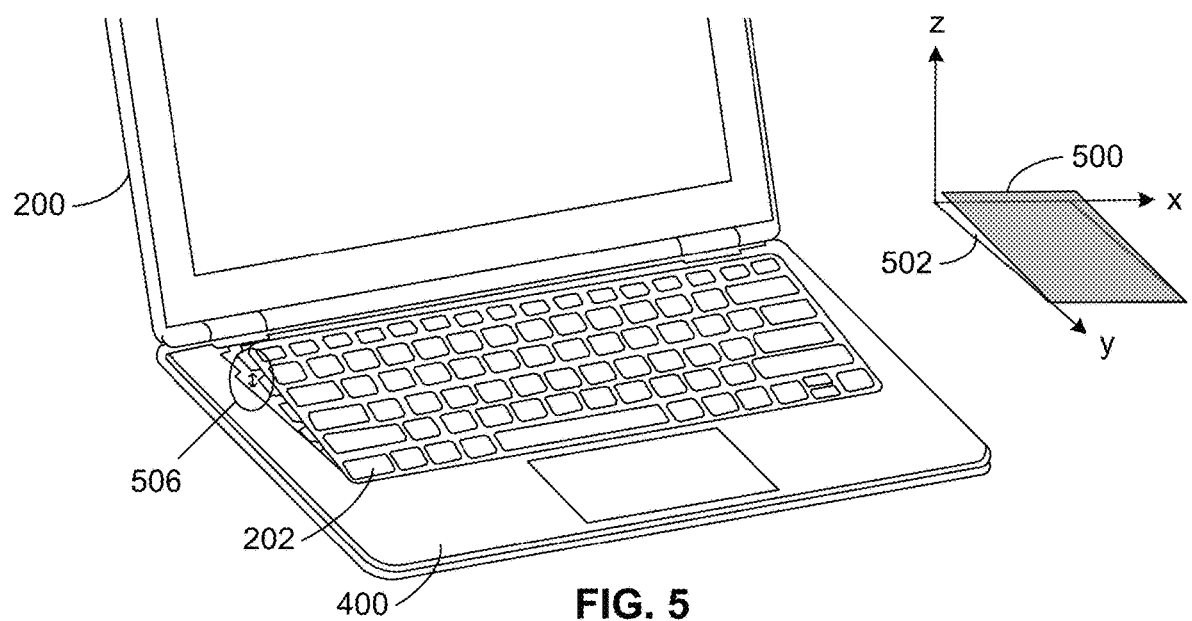
FIG. 5 is a schematic illustration of an example keyboard movement relative to an example base.

In some examples, when the analyzer 120 determines a new position of the keyboard 202, the analyzer 120 instructs the example keyboard tilt angle adjuster 122 to change the position of the keyboard 202. For example, the analyzer 120 can instruct the keyboard tilt angle adjuster 122 to increase or decrease a tilt of the keyboard 202 relative to the base 400 of the device or relative to a support surface. As illustrated in FIG. 5, the analyzer 120 can cause the keyboard tilt angle adjuster 122 to change, for example, a position of an end of the keyboard 202 in the Z-direction, which will cause a tilt in a keyboard plane 500 relative to a base plane 502. The example illustrated in FIG. 5 shows adjustment of the position of the keyboard 202 relative to the base 400 in a clamshell formfactor with the keyboard 202 fixed to the base 400. The keyboard tilt angle adjuster 122 causes one side 506 of the keyboard 202 to elevate or lower depending on the ergonomically enhanced position determined by the analyzer 120. In other examples, such as for example two-in-one electronic devices with a keyboard fixed to a detachable base, the keyboard tilt angle adjuster 122 adjusts the keyboard plane 500 relative to the plane of the detachable base. In yet other examples, such as for example with an external, standalone keyboard, the keyboard tilt angle adjuster 122 changes the keyboard plane 500 relative to a support surface.

Figure 6:
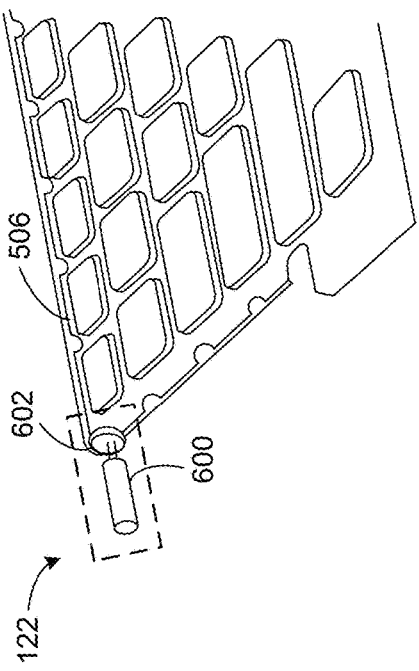
FIG. 6 is a schematic illustration of an example actuator to move a keyboard.
Figure 6:
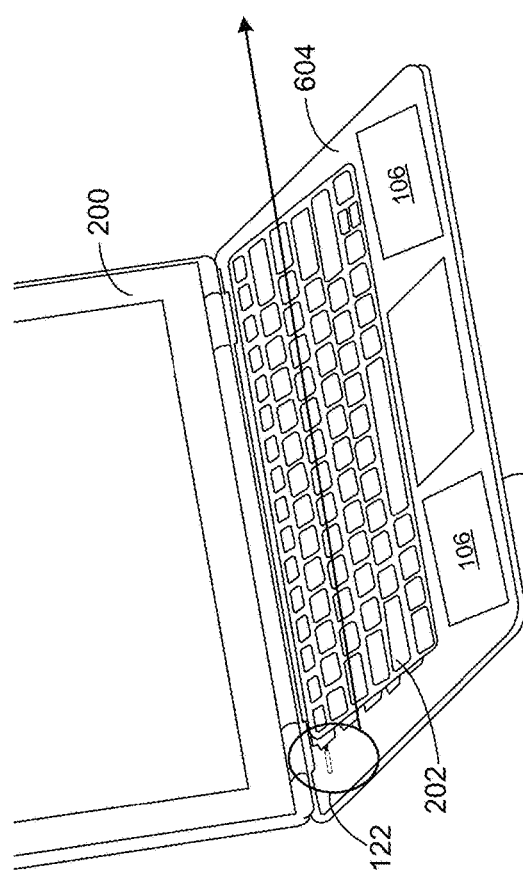

FIG. 6 shows an example keyboard tilt angle adjuster 122 that includes a stepper motor 600 with a cam 602 fitted below the keyboard 202 that may be used to elevate one end 506 of the keyboard 202 and that can be used to adjust the angle of the keyboard plane 500. To adjust the position of the keyboard 202, the analyzer 120 sends instructions to the keyboard tilt angle adjuster 122 to activate the stepper motor 600 to rotate the cam 602. As the cam 602 rotates, the keyboard plane 500 and, thus, the position of the keyboard 202 changes. The rotation of the motor 600 can be controlled to allow for different angle positions of the keyboard 202. The keyboard 202 may either be hinged, run or rails, or be allowed to freely move at the other end 604 in this and in other examples.

Figure 7:
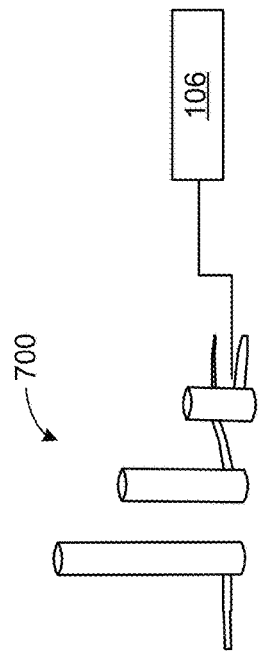
FIG. 7 is a schematic illustration of an additional example actuator to move a keyboard.
Figure 7:
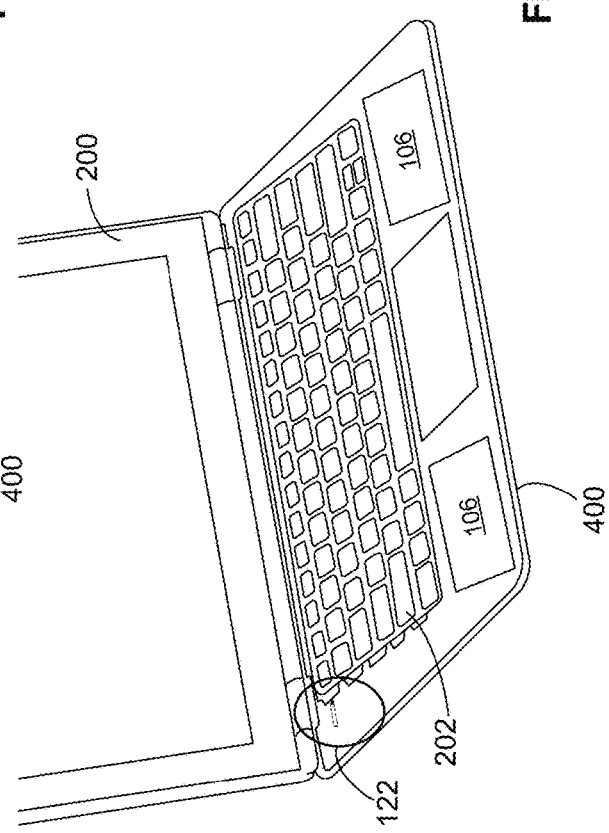

FIG. 7 shows another example keyboard tilt angle adjuster 122 that includes a linear piezo actuator 700. The piezo actuator 700 may be a piezoelectric motor. To adjust the position of the keyboard 202, the analyzer 120 sends instructions to the keyboard tilt angle adjuster 122 to activate the linear piezo actuator 700 to extend or retract. As the linear piezo actuator 700 moves, the keyboard plane 500 and, thus, the position of the keyboard 202 changes.

Figure 8:
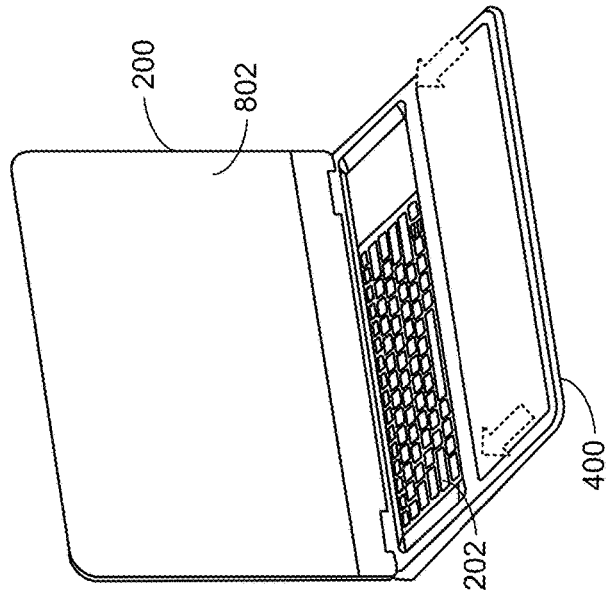
FIG. 8 is a schematic illustration of an example movement of a keyboard.

In addition to adjusting a tilt angle of the keyboard 202, the example system 100 of FIG. 1 can ergonomically position the keyboard 202 by moving more than just one end of the keyboard 202. For example, FIG. 8 illustrates the device 200 including a removable compute mode 800 and the keyboard 202 is slidably adjustable along the base 400. When the user wants the keyboard 202 adjusted, the example system 100 of FIG. 1 can be activated to position the keyboard 202 toward the screen 802 in an ergonomically enhanced position. In some examples, the system 100 stores the ergonomically enhanced position in the database 110. The position can be recreated by the keyboard tilt angle adjuster 122 for a user when, for example, the user logins to the device 200. Thus, in some examples, the keyboard tilt angle adjuster 122 may cause adjustment of the tilt of the keyboard and other positioning of the keyboard including, for example, lateral displacement.

Figure 9:
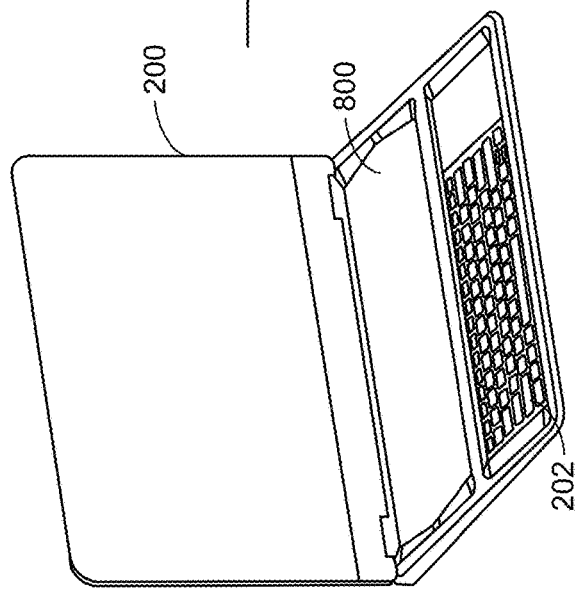
FIG. 9 is a schematic illustration of an example elevator to adjust a keyboard position.

In some examples the keyboard tilt angle adjuster 122 can reposition the entire device 200 and not only the keyboard 202. For example, FIG. 9 shows the keyboard tilt angle adjuster 122 including an elevator 900. The elevator 900 is an external elevator that includes an inclination mechanism coupled to the base 400 of the device 200. In this example, the keyboard 202 remains fixed to the base 400. When the analyzer 120 determines that the position of the keyboard 202 is to be changed, the analyzer 120 sends instructions to the keyboard tilt angle adjuster 122, which in this example is the elevator 900. The elevator 900 extends or retracts for ergonomic positioning.

Figure 10:
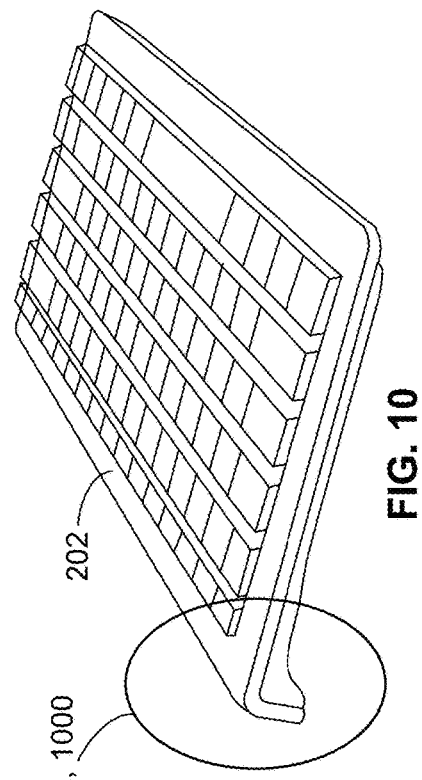
FIG. 10 is a schematic illustration of another example elevator.

FIG. 10 shows another example elevator 1000 for an external keyboard 202. In this example, the elevator 1000 is integral with the chassis of the keyboard 202. Also in this example, the elevator 1000 is an external elevator. When the analyzer 120 determines that the position of the keyboard 202 is to be changed, the analyzer 120 sends instructions to the keyboard tilt angle adjuster 122, which in this example is the elevator 1000, to extend or retract for ergonomic positioning.

While an example manner of implementing the example system 100 to position a keyboard is illustrated in FIG. 1, one or more of the elements, processes and/or devices illustrated in FIG. 1 may be combined, divided, re-arranged, omitted, eliminated and/or implemented in any other way. Further, the example hand position detector 102, the example keyboard orientation detector 104, the example wrist sensor(s) 106, the example pattern comparator 108, the example database 110, the example finger sensor(s) 112, the example finger angle detector 114, the example pressure sensor(s), the example device orientation sensor(s) 118, the example analyzer 120, the example keyboard tilt angle adjuster 122, and/or, more generally, the example system 100 of FIG. 1 may be implemented by hardware, software, firmware and/or any combination of hardware, software and/or firmware. Thus, for example, any of the example hand position detector 102, the example keyboard orientation detector 104, the example wrist sensor(s) 106, the example pattern comparator 108, the example database 110, the example finger sensor(s) 112, the example finger angle detector 114, the example pressure sensor(s), the example device orientation sensor(s) 118, the example analyzer 120, the example keyboard tilt angle adjuster 122, and/or, more generally, the example system 100 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example hand position detector 102, the example keyboard orientation detector 104, the example wrist sensor(s) 106, the example pattern comparator 108, the example database 110, the example finger sensor(s) 112, the example finger angle detector 114, the example pressure sensor(s), the example device orientation sensor(s) 118, the example analyzer 120, and/or the example keyboard tilt angle adjuster 122, is/are hereby expressly defined to include a non-transitory computer readable storage device or storage disk such as a memory, a digital versatile disk (DVD), a compact disk (CD), a Blu-ray disk, etc. including the software and/or firmware. Further still, the example system 100 of FIG. 1 may include one or more elements, processes and/or devices in addition to, or instead of, those illustrated in FIG. 1, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 11:
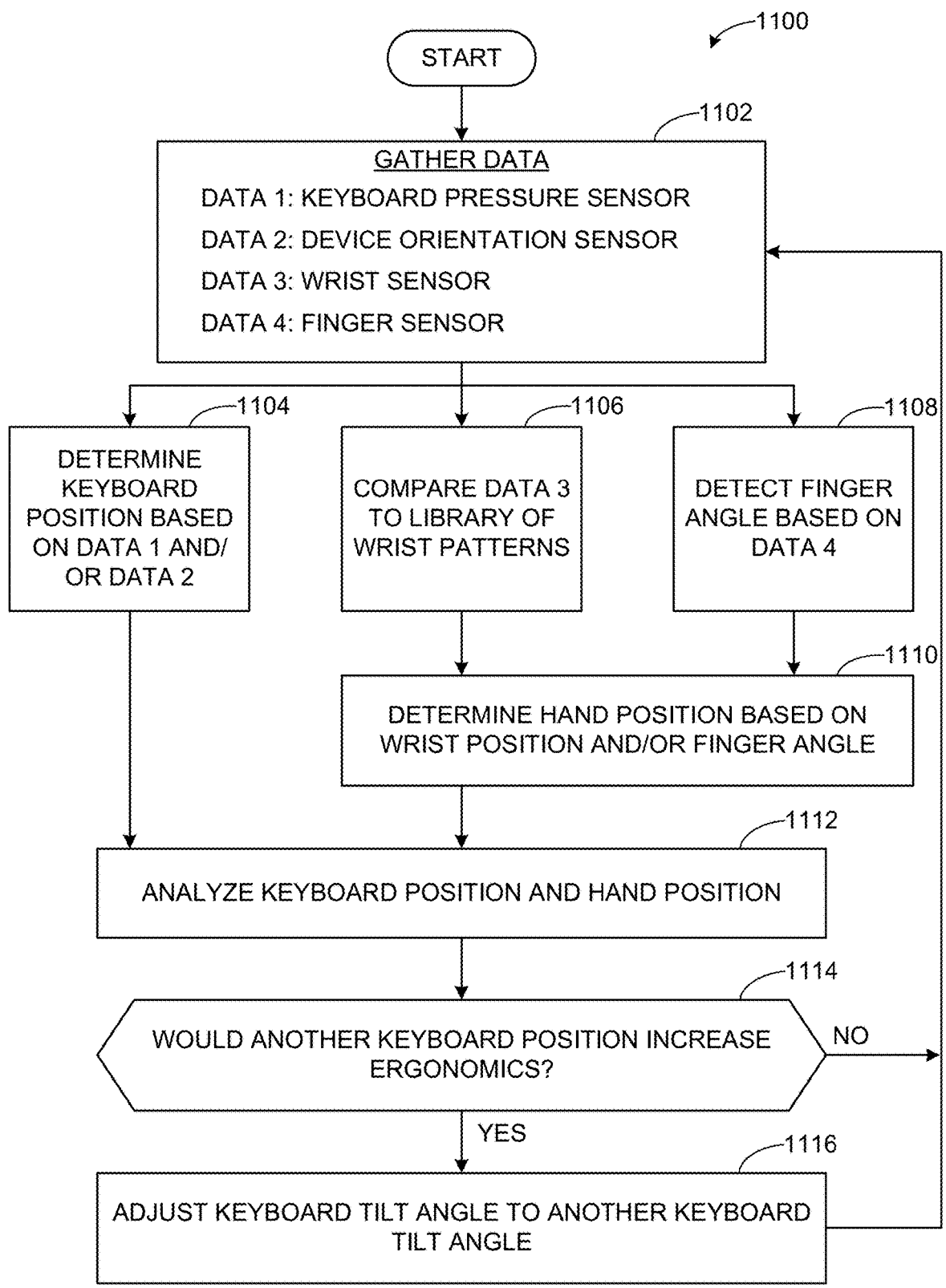
FIG. 11 is a flowchart representative of machine readable instructions which may be executed to implement the example system to position a keyboard of FIG. 1.

A flowchart representative of example hardware logic, machine readable instructions, computer readable instructions, hardware implemented state machines, and/or any combination thereof for implementing the system 100 of FIG. 1 is shown in FIG. 11. The machine readable instructions may be an executable program or portion of an executable program for execution by a computer processor such as the processor 1212 shown in the example processor platform 1200 discussed below in connection with FIG. 12. The program may be embodied in software stored on a non-transitory computer readable storage medium such as a CD-ROM, a floppy disk, a hard drive, a DVD, a Blu-ray disk, or a memory associated with the processor 1012, but the entire program and/or parts thereof could alternatively be executed by a device other than the processor 1012 and/or embodied in firmware or dedicated hardware. Further, although the example program is described with reference to the flowchart illustrated in FIG. 11, many other methods of implementing the example system 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example process of FIG. 11 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

FIG. 11 includes a flowchart representative of machine readable instructions or a program 1100 that may be executed to implement the example system 100 of FIG. 1 to position a keyboard. The example program 1100 includes instructions to gather data (block 1102). For example, the pressure sensor(s) 116 coupled to the keyboard 202 gathers data related to the placement of the keyboard 202 on a support surface (DATA 1) (block 1102). The device orientation sensor(s) 118, which may include, for example, an accelerometer, gyroscope, and/or other positioning sensors, gathers data related to the device orientation (DATA 2) (block 1102). The wrist sensor(s) 106 gathers data related to wrist and/or palm pressure patterns on a wrist and/or palm rest (DATA 3) (block 1102). The finger sensor(s) 112 gathers data related to the positioning of a finger including, for example, an angle of a finger as it strikes a key 306 of the keyboard 202 (DATA 4) (block 1102).

In the example program 1100, the keyboard orientation detector 104 determines the position of the keyboard 202 based on DATA 1 and/or DATA 2 (block 1104).

The pattern comparator 108 of the hand position detector 102 compares DATA 3 to a library of wrist patterns stored in the database 110, for example (block 1106). Based on the comparison, the pattern comparator 108 determines the wrist position of the user. The finger angle detector 114 of the hand position detector 102 detects a finger angle based on DATA 4 (block 1108). The hand position detector 102 determines hand position based on the wrist position and/or the finger angle (block 1110).

The analyzer 120 analyzes the keyboard position detected by the keyboard orientation detector 104 and the hand position 1112 detected by the hand position detector 102 (block 1112). The analyzer 120 determines if another keyboard position such as another tilt angle would increase ergonomics (block 1114). If another keyboard board position would not increase ergonomics, the example program 1100 returns to continuing to gather data (block 1102). If another keyboard position would increase ergonomics, the analyzer 120 instructs the keyboard tilt angle adjuster 122 to adjust the keyboard tilt angle to another keyboard tilt angle to enhance ergonomics (block 1116). In some example, the if another keyboard position would increase ergonomics, the analyzer 120 instructs the keyboard tilt angle adjuster 122 to adjust other positioning of the keyboard in addition to or alternatively to the tile angle adjustment to enhance ergonomics. The example program 1100 continues gathering data (block 1102).

Figure 12:
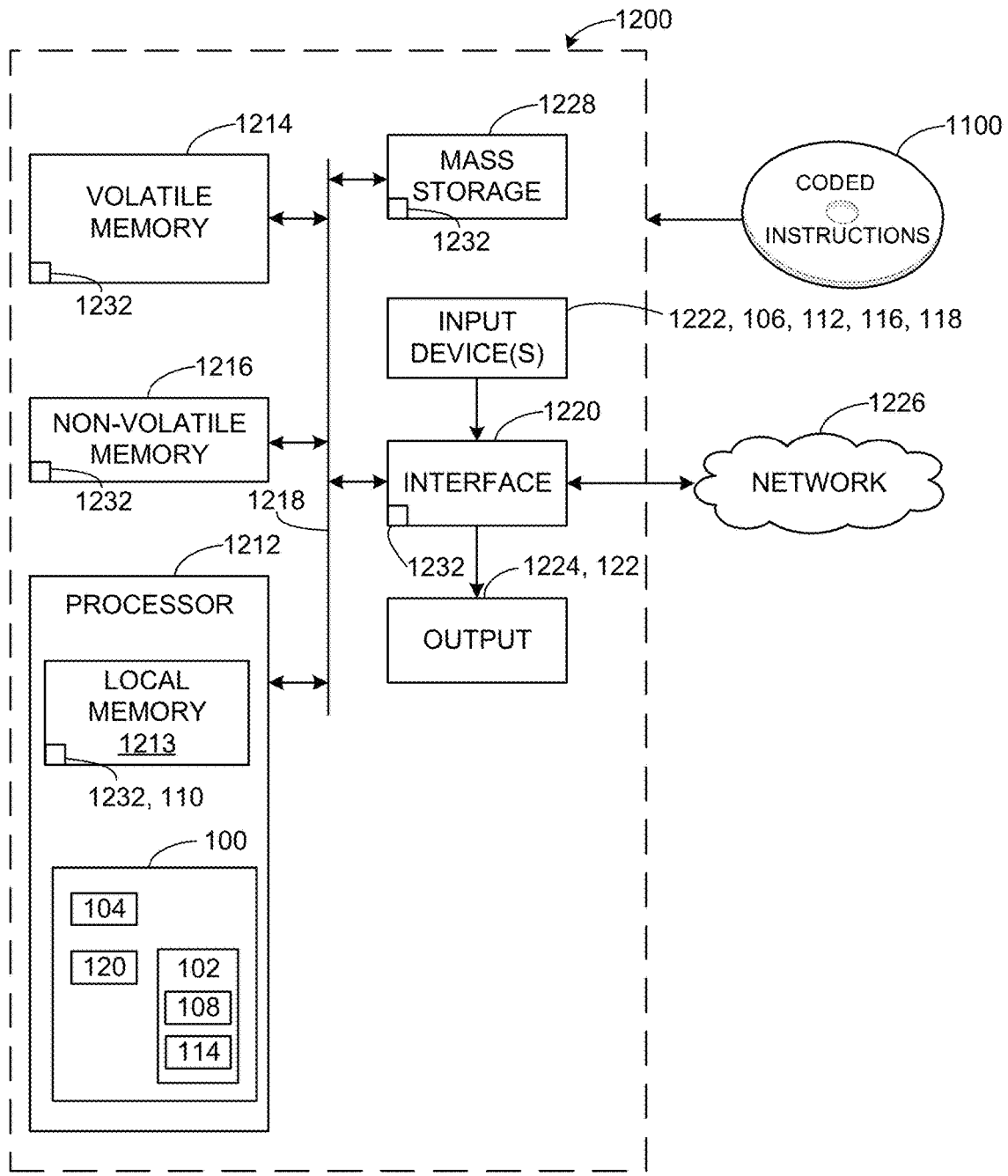
FIG. 12 is a block diagram of an example processing platform structured to execute the instructions of FIG. 11 to implement the example system to position a keyboard of FIG. 1.

FIG. 12 is a block diagram of an example processor platform 1200 structured to execute the instructions of FIG. 11 to implement the apparatus or system of FIG. 1. The processor platform 1200 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 1200 of the illustrated example includes a processor 1212. The processor 1212 of the illustrated example is hardware. For example, the processor 1212 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements portions of the example system 100, the example hand position detector 102, the example keyboard orientation detector 104, the example pattern comparator 108, the example finger angle detector 114, the example device orientation sensor(s) 118, and the example analyzer 120.

The processor 1212 of the illustrated example includes a local memory 1213 (e.g., a cache) and the database 110. The processor 1212 of the illustrated example is in communication with a main memory including a volatile memory 1214 and a non-volatile memory 1216 via a bus 1218. The volatile memory 1214 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1216 may be implemented by flash memory and/or any other desired type of memory device. Access to the main memory 1214, 1216 is controlled by a memory controller.

The processor platform 1200 of the illustrated example also includes an interface circuit 1220. The interface circuit 1220 may be implemented by any type of interface standard, such as an Ethernet interface, a universal serial bus (USB), a Bluetooth® interface, a near field communication (NFC) interface, and/or a PCI express interface.

In the illustrated example, one or more input devices 1222 are connected to the interface circuit 1220. The input device(s) 1022 permit(s) a user to enter data and/or commands into the processor 1212. The input device(s) can be implemented by, for example, an audio sensor, a microphone, a camera (still or video), a keyboard, a button, a mouse, a touchscreen, a track-pad, a trackball, isopoint and/or a voice recognition system. The input devices 1222 also include data input components such as, for example, the example wrist sensor(s) 106, the example finger sensor(s) 112, the example pressure sensor(s) 116, and the example device orientation sensor(s) 118.

One or more output devices 1224 are also connected to the interface circuit 1220 of the illustrated example. The output devices 1224 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1220 of the illustrated example, thus, typically includes a graphics driver card, a graphics driver chip and/or a graphics driver processor. The output devices 1224 also include the example keyboard tilt angle adjuster 122.

The interface circuit 1220 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1226. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1200 of the illustrated example also includes one or more mass storage devices 1228 for storing software and/or data. Examples of such mass storage devices 1228 include floppy disk drives, hard drive disks, compact disk drives, Blu-ray disk drives, redundant array of independent disks (RAID) systems, and digital versatile disk (DVD) drives.

The machine executable instructions 1100 of FIG. 11 may be stored in the mass storage device 1228, in the volatile memory 1214, in the non-volatile memory 1216, and/or on a removable non-transitory computer readable storage medium such as a CD or DVD.

From the foregoing, it will be appreciated that example apparatus, systems, articles of manufacture, and methods have been disclosed that enhance the user experience with a computer device. Previously, ergonomic adjustment was effective by users manually adjusting a keyboard to between two possible positions that were not ergonomic or suboptimal in terms of ergonomics. These positions were very limited and often included only a flat keyboard position and one tilted position. Re-adjustments would be manually performed each time the support surface and position of the user's hands change.

The examples disclosed herein provide ergonomic positioning of the keyboard for users including automatic positioning, allowing the users to use clamshell/laptop form factors as well as external keyboards with greater convenience and comfort. The ergonomic positions disclosed herein include more than two discrete positions. There can potentially be an infinite number of discrete positions for keyboard placement and positioning based on the examples disclosed herein.

The disclosed example apparatus, systems, articles of manufacture, and methods improve the efficiency of using a computing device by adjusting the position of the keyboard to an ergonomically enhanced position for the particular user in the particular computing environment. In some examples, the adjustment is automatic. These examples enables users to operate computing devices for longer periods of time with increased comfort. The disclosed example apparatus, systems, articles of manufacture, and methods are accordingly directed to one or more improvement(s) in the functioning of a computer.

Many example keyboard position adjustment systems, apparatus, articles or manufacture, and methods are disclosed herein. Example 1 includes a keyboard position adjustment system that includes a keyboard orientation detector to determine a first keyboard position of a keyboard; a hand position detector to determine a hand position near the keyboard; and an adjuster to move the keyboard to a second keyboard position based on the first keyboard position and the hand position. In some examples Example 1 is based on or otherwise incorporated with Example 7.

Example 2 includes the keyboard position adjustment system of Example 1, wherein the keyboard is coupled to a base and the keyboard orientation detector includes a sensor on the base to detect a placement of the keyboard on a surface.

Example 3 includes the keyboard position adjustment system of Example 2, wherein the sensor is a pressure sensor.

Example 4 includes the keyboard position adjustment system of Example 2, wherein the adjuster moves the keyboard relative to the base.

Example 5 includes the keyboard position adjustment system of Example 1, wherein the keyboard orientation detector includes a sensor disposed in the keyboard to determine an orientation of the keyboard.

Example 6 includes the keyboard position adjustment system of Example 5, wherein the keyboard orientation detector includes an accelerometer and a gyroscope.

Example 7 includes a keyboard position adjustment system that includes a hand position detector to determine a hand position near a keyboard; and an adjuster to move the keyboard from a first keyboard position to a second keyboard position based on the hand position.

Example 8 includes the keyboard position adjustment system of Examples 1 or 7, wherein the hand position detector includes a wrist sensor.

Example 9 includes the keyboard position adjustment system of Examples 1 or 7, wherein the hand position detector includes a comparator to compare a wrist pressure pattern to a library of pressure patterns to determine a wrist position.

Example 10 includes the keyboard position adjustment system of Examples 1 or 7, wherein the hand position detector includes a finger angle detector.

Example 11 includes the keyboard position adjustment system of Example 10, wherein the finger angle detector includes an infrared curtain.

Example 12 includes the keyboard position adjustment system of Example 10, wherein the finger angle detector includes an ultrasonic sensor.

Example 13 includes the keyboard position adjustment system of Example 10, wherein the finger angle detector includes a capacitance sensor.

Example 14 includes the keyboard position adjustment system of Examples 1-13, wherein the adjuster includes a stepper motor.

Example 15 includes the keyboard position adjustment system of Examples 1-13, wherein the adjuster includes a piezo actuator.

Example 16 includes the keyboard position adjustment system of Examples 1-13, wherein the adjuster includes an external elevator.

Example 17 includes the keyboard position adjustment system of Example 16, wherein the external elevator is integral with a chassis of the keyboard.

Example 18 includes a keyboard position adjustment system that includes means for determining a first keyboard position of a keyboard; means for determining a hand position near the keyboard; and means for moving the keyboard to a second keyboard position based on the first keyboard position and the hand position.

Example 19 includes the keyboard position adjustment system of Example 18, wherein the keyboard is coupled to a based and the means for determining a first keyboard position includes a sensor on the base to detect a placement of the keyboard on a surface. In some examples Example 19 is based on or otherwise incorporated with Example 24.

Example 20 includes the keyboard position adjustment system of Example 19, wherein the sensor is a pressure sensor.

Example 21 includes the keyboard position adjustment system of Example 19, wherein the means for moving moves the keyboard relative to the base.

Example 22 includes the keyboard position adjustment system of Example 18, wherein the means for determining a first keyboard position includes a sensor disposed in the keyboard to determine an orientation of the keyboard.

Example 23 includes the keyboard position adjustment system of Example 22, wherein the sensor includes an accelerometer and a gyroscope.

Example 24 includes a keyboard position adjustment system that includes means for determining a hand position near a keyboard; and means for moving the keyboard from a first keyboard position to a second keyboard position based on the hand position.

Example 25 includes the keyboard position adjustment system of Examples 18 or 24, wherein the means for determining a hand position includes a wrist sensor.

Example 26 includes the keyboard position adjustment system of Examples 18 or 24, wherein the means for determining a hand position includes means for comparing a wrist pressure pattern to a library of pressure patterns to determine a wrist position.

Example 27 includes the keyboard position adjustment system of Examples 18 or 24, wherein the means for determining a hand position includes means for determining a finger angle.

Example 28 includes the keyboard position adjustment system of Example 27, wherein the means for determining a finger angle includes an infrared curtain.

Example 29 includes the keyboard position adjustment system of Example 27, wherein the means for determining a finger angle includes an ultrasonic sensor.

Example 30 includes the keyboard position adjustment system of Example 27, wherein the means for determining a finger angle includes a capacitance sensor.

Example 31 includes the keyboard position adjustment system of Examples 18-30, wherein the means for moving the keyboard includes a stepper motor.

Example 32 includes the keyboard position adjustment system of Examples 18-30, wherein the means for moving the keyboard includes a piezo actuator.

Example 33 includes the keyboard position adjustment system of Examples 18-30, wherein the means for moving the keyboard includes an external elevator.

Example 34 includes the keyboard position adjustment system of Example 33, wherein the external elevator is integral with a chassis of the keyboard.

Example 35 includes a non-transitory computer readable storage medium comprising computer readable instructions that, when executed, cause a machine to, at least: determine a first keyboard position of a keyboard; determine a hand position near the keyboard; and move the keyboard to a second keyboard position based on the first keyboard position and the hand position. In some examples Example 35 is based on or otherwise incorporated with Example 41.

Example 36 includes the computer readable storage medium of Example 35, wherein the instructions cause the machine to determine the first keyboard position by: accessing sensor data gathered from a sensor on a base, the keyboard coupled to the base; and detecting a placement of the keyboard on a surface based on the sensor data.

Example 37 includes the computer readable storage medium of Example 36, wherein the sensor is a pressure sensor.

Example 38 includes the computer readable storage medium of Example 36, wherein the instruction cause the machine to move the keyboard by: moving the keyboard relative to the base.

Example 39 includes the computer readable storage medium of Example 35, wherein the instruction cause the machine to determine the first keyboard position by: accessing sensor data gathered from a sensor disposed in the keyboard; and determining an orientation of the keyboard based on the sensor data.

Example 40 includes the computer readable storage medium of Example 39, wherein the sensor includes an accelerometer and a gyroscope.

Example 41 includes a non-transitory computer readable storage medium comprising computer readable instructions that, when executed, cause one or more processors to, at least: determine a hand position near a keyboard; and move the keyboard from a first keyboard position to a second keyboard position based on the hand position.

Example 42 includes the computer readable storage medium of Examples 35 or 41, wherein the instructions cause the machine to determine the hand position by: accessing sensor data gathered from a wrist sensor; determining a wrist pressure pattern based on the sensor data; performing a comparison of the wrist pressure pattern to a library of pressure patterns; and determining a wrist position based on the comparison.

Example 43 includes the computer readable storage medium of Examples 35 or 41, wherein the instruction cause the machine to determine a hand position by: accessing sensor data gathered from a finger angle detector; and determining the hand position based on the sensor data.

Example 44 includes the computer readable storage medium of Example 43, wherein the finger angle detector includes an infrared curtain.

Example 45 includes the computer readable storage medium of Example 43, wherein the finger angle detector includes an ultrasonic sensor.

Example 46 includes the computer readable storage medium of Example 43, wherein the finger angle detector includes a capacitance sensor.

Example 47 includes the computer readable storage medium of Examples 35-46, wherein the instructions cause the machine to move the keyboard by actuating a stepper motor.

Example 48 includes the computer readable storage medium of Examples 35-46, wherein the instructions cause the machine to move the keyboard by actuating a piezo actuator.

Example 49 includes the computer readable storage medium of Examples 35-46, wherein the instructions cause the machine to move the keyboard by actuating an external elevator.

Example 50 includes the computer readable storage medium of Example 49, wherein the external elevator is integral with a chassis of the keyboard.

Example 51 includes a method to adjust a keyboard position, where the method includes determining a first keyboard position of a keyboard; determining a hand position near the keyboard; and moving the keyboard to a second keyboard position based on the first keyboard position and the hand position. In some examples Example 51 is based on or otherwise incorporated with Example 57.

Example 52 includes the method of Example 51, wherein determining the first keyboard position includes: accessing sensor data gathered from a sensor on a base, the keyboard coupled to the base; and detecting a placement of the keyboard on a surface based on the sensor data.

Example 53 includes the method of Example 52, wherein the sensor is a pressure sensor.

Example 54 includes the method of Example 52, wherein moving the keyboard includes moving the keyboard relative to the base.

Example 55 includes the method of Example 51, wherein determining the first keyboard position includes: accessing sensor data gathered from a sensor disposed in the keyboard; and determining an orientation of the keyboard based on the sensor data.

Example 56 includes the method of Example 55, wherein the sensor includes an accelerometer and a gyroscope.

Example 57 includes a method to adjust a keyboard position, wherein the method includes: determining a hand position near a keyboard; and moving the keyboard from a first keyboard position to a second keyboard position based on the hand position.

Example 58 includes the method of Examples 51 or 57, wherein determining the hand position includes: accessing sensor data gathered from a wrist sensor; determining a wrist pressure pattern based on the sensor data; performing a comparison of the wrist pressure pattern to a library of pressure patterns; and determining a wrist position based on the comparison.

Example 59 includes the method of Examples 51 or 57, wherein determining the hand position includes: accessing sensor data gathered from a finger angle detector; and determining the hand position based on the sensor data.

Example 60 includes the method of Example 59, wherein the finger angle detector includes an infrared curtain.

Example 61 includes the method of Example 59, wherein the finger angle detector includes an ultrasonic sensor.

Example 62 includes the method of Example 59, wherein the finger angle detector includes a capacitance sensor.

Example 63 includes the method of Examples 51-62, wherein moving the keyboard includes actuating a stepper motor.

Example 64 includes the method of Examples 51-62, wherein moving the keyboard includes actuating a piezo actuator.

Example 65 includes the method of Examples 51-62, wherein moving the keyboard includes actuating an external elevator.

Example 66 includes the method of Example 65, wherein the external elevator is integral with a chassis of the keyboard.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A keyboard position adjustment system comprising:
   a keyboard orientation detector to determine a first keyboard position of a keyboard of an electronic device;
   a wrist sensor to detect a pressure pattern of at least one of a palm or a wrist of a user on at least one of the keyboard or the electronic device;
   a hand position detector to:
      perform a comparison of the pressure pattern to a plurality of pressure patterns correlated with known wrist positions; and
      identify a wrist position of the user as matching a known wrist position based on the comparison; and
   an adjuster to move the keyboard to a second keyboard position based on the first keyboard position and the wrist position.

2. The keyboard position adjustment system of claim 1, wherein the keyboard is coupled to a base and the keyboard orientation detector includes a sensor on the base to detect a placement of the keyboard on a surface.

3. The keyboard position adjustment system of claim 2, wherein the sensor is a pressure sensor.

4. The keyboard position adjustment system of claim 2, wherein the adjuster moves the keyboard relative to the base.

5. The keyboard position adjustment system of claim 1, wherein the keyboard orientation detector includes a sensor disposed in the keyboard to determine an orientation of the keyboard.

6. The keyboard position adjustment system of claim 5, wherein the keyboard orientation detector includes an accelerometer and a gyroscope.

7. A keyboard position adjustment system comprising:
   a wrist sensor to detect a pressure pattern of at least one of a palm or a wrist of a user on at least one of a keyboard or an electronic device;
   a hand position detector to:
      access a plurality of pressure patterns of known wrist positions;
      perform a comparison of the pressure pattern to one or more of the pressure patterns of known wrist positions;

identify a wrist position of the user as matching a known wrist position based on the comparison; and determine a hand position on or near the keyboard based on the wrist position; and an adjuster to move the keyboard from a first keyboard position to a second keyboard position based on the hand position.

8. The keyboard position adjustment system of claim 7, wherein the hand position detector includes a finger angle detector to detect an angle of approach of a finger of the user as the user strikes a key of the keyboard.

9. The keyboard position adjustment system of claim 8, wherein the finger angle detector includes:

a plurality of infrared projectors positioned in perpendicular rows and columns to project an infrared curtain in a grid over the keyboard; and an infrared camera to gather occlusion data when a finger of the user occludes infrared light in the infrared curtain, the hand position detector to determine the hand position based on the occlusion data.

10. The keyboard position adjustment system of claim 8, wherein the finger angle detector includes an ultrasonic sensor.

11. The keyboard position adjustment system of claim 8, wherein the finger angle detector includes a capacitance sensor.

12. The keyboard position adjustment system of claim 7, wherein the adjuster includes a stepper motor.

13. The keyboard position adjustment system of claim 7, wherein the adjuster includes a piezo actuator.

14. The keyboard position adjustment system of claim 7, wherein the adjuster includes an external elevator coupled to an exterior surface of the keyboard.

15. The keyboard position adjustment system of claim 14, wherein the external elevator is integral with a chassis of the keyboard.

16. A non-transitory computer readable storage medium comprising computer readable instructions that, when executed, cause one or more processors to, at least:

access sensor data gathered from a wrist sensor;

determine a wrist pressure pattern based on the sensor data;

perform a comparison of the wrist pressure pattern to a plurality of pressure patterns of known wrist positions;

determine a wrist position based on the comparison;

determine a hand position near a keyboard based on the wrist position; and move the keyboard from a first keyboard position to a second keyboard position based on the hand position.

17. The computer readable storage medium of claim 16, wherein the instruction cause the machine to determine a hand position by:

accessing sensor data gathered from a finger angle detector; and determining the hand position based on the sensor data.

18. The computer readable storage medium of claim 17, wherein the finger angle detector includes an infrared curtain.

19. The computer readable storage medium of claim 17, wherein the finger angle detector includes an ultrasonic sensor.

20. The computer readable storage medium of claim 17, wherein the finger angle detector includes a capacitance sensor.

21. The computer readable storage medium of claim 16, wherein the instructions cause the machine to move the keyboard by actuating a stepper motor.

22. The computer readable storage medium of claim 16, wherein the instructions cause the machine to move the keyboard by actuating a piezo actuator.

23. The computer readable storage medium of claim 16, wherein the instructions cause the machine to move the keyboard by actuating an external elevator coupled to an exterior surface of the keyboard.

24. The computer readable storage medium of claim 16, wherein the external elevator is integral with a chassis of the keyboard.

* * * * *